United States Patent
Menard et al.

(10) Patent No.: US 10,684,243 B2
(45) Date of Patent: Jun. 16, 2020

(54) DEVICE FOR TRIGGERING AN ACTION ON AN OPENING PANEL OF A MOTOR VEHICLE

(71) Applicant: VALEO SECURITE HABITACLE, Creteil (FR)

(72) Inventors: Eric Menard, Créteil (FR); Ciprian Musat, Créteil (FR)

(73) Assignee: VALEO SECURITE HABITACLE, Créteil (FR)

( * ) Notice: Subject to any disclaimer, the term of this patent is extended or adjusted under 35 U.S.C. 154(b) by 60 days.

(21) Appl. No.: 14/361,452

(22) PCT Filed: Nov. 30, 2012

(86) PCT No.: PCT/EP2012/074045
§ 371 (c)(1),
(2) Date: May 29, 2014

(87) PCT Pub. No.: WO2013/079641
PCT Pub. Date: Jun. 6, 2013

(65) Prior Publication Data
US 2014/0327454 A1 Nov. 6, 2014

(30) Foreign Application Priority Data
Dec. 2, 2011 (FR) .................................. 11 03686

(51) Int. Cl.
*G01N 27/22* (2006.01)
*H03K 17/955* (2006.01)
(Continued)

(52) U.S. Cl.
CPC ............ *G01N 27/22* (2013.01); *E05B 81/77* (2013.01); *G01R 27/2605* (2013.01);
(Continued)

(58) Field of Classification Search
CPC .......... E05B 81/77; E05B 81/76; G01N 27/02; H03K 17/955; H03K 2217/960705; G07C 2209/65; G01R 27/2605
See application file for complete search history.

(56) References Cited

U.S. PATENT DOCUMENTS 7,576,631 B1    8/2009  Bingle et al.
7,689,013 B2 *  3/2010  Shinzaki ............ G06K 9/0012
                                                         340/5.52
(Continued)

FOREIGN PATENT DOCUMENTS

DE   10 2004 045 152 A1   3/2006
DE   10 2004 046 903 A1   3/2006
(Continued)

OTHER PUBLICATIONS

International Search Report for corresponding International Application No. PCT/EP2012/074045, dated Jan. 30, 2013 (3 pages).
(Continued)

Primary Examiner — Jeff W Natalini
(74) Attorney, Agent, or Firm — Osha Liang LLP

(57) ABSTRACT

The invention relates to a device for triggering an action on an opening panel of a motor vehicle. The device (1) comprises in particular: a capacitive sensor (C) for detecting a variation in capacitance, comprising at least three electrodes (E1, E2, E3), said at least three electrodes (E1, E2, E3) forming a detection pattern (M); and a processing unit (2) connected to the capacitive sensor (C) for processing output signals front the capacitive sensor (C), said output signals being representative of the capacitance of each of the electrodes (E1, E2, E3). The triggering device (1) is characterised in that: the positioning of the electrodes (E1, E2, E3) is defined such that at least one of the electrodes (E1, E2, E3) is not covered by a hand approaching the detection pattern (M), and the processing unit (2) is designed to
(Continued)

Figure 1:
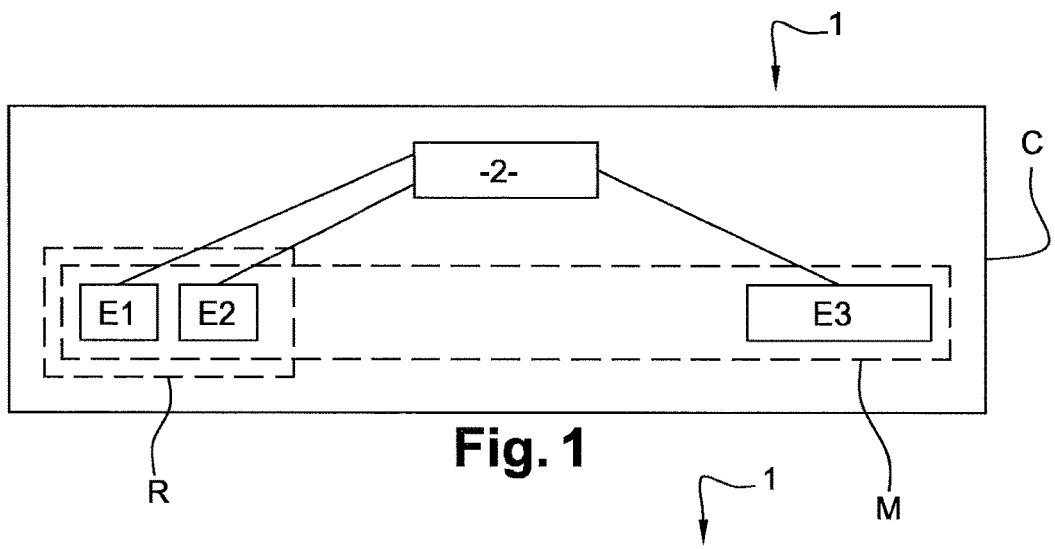

perform a triggering action on the opening panel of the motor vehicle when a band approaches said detection pattern (M).

8 Claims, 1 Drawing Sheet

(51) Int. Cl.
    *E05B 81/76*     (2014.01)
    *G01R 27/26*     (2006.01)

(52) U.S. Cl.
    CPC ....... *H03K 17/955* (2013.01); *G07C 2209/65* (2013.01); *H03K 2217/960705* (2013.01)

(56) References Cited

U.S. PATENT DOCUMENTS

| | | | |
|---|---|---|---|
| 7,710,245 B2 * | 5/2010 | Pickering | ............ B60R 25/2045 340/426.28 |
| 2003/0122556 A1 * | 7/2003 | Sueyoshi | .............. B60R 25/246 324/686 |
| 2006/0186992 A1 | 8/2006 | Freyholdt et al. | |
| 2006/0238385 A1 * | 10/2006 | Steenwyk | ............ B60N 2/0228 341/33 |
| 2011/0181387 A1 | 7/2011 | Popelard | |
| 2011/0254570 A1 * | 10/2011 | Sage | .................. H03K 17/9622 324/679 |

FOREIGN PATENT DOCUMENTS

| | | |
|---|---|---|
| WO | 03/095776 A1 | 11/2003 |
| WO | 2010/103084 A1 | 9/2010 |

OTHER PUBLICATIONS

Search Report for corresponding French Application No. 1103686, dated Jul. 30, 2012 (3 pages).

* cited by examiner

DEVICE FOR TRIGGERING AN ACTION ON AN OPENING PANEL OF A MOTOR VEHICLE

The present invention relates to a device for triggering an action on an opening panel of a motor vehicle. It applies in particular to the field of locking and unlocking of the opening panel of a vehicle door. The invention can be applied particularly advantageously in the automotive field.

It is known practice to use a device for triggering the locking and unlocking of a door of a motor vehicle comprising a capacitive sensor to detect a hand or a finger of a the user of the vehicle. As the human body is composed of two-thirds water, the approach of the finger or the hand of the user toward the capacitive sensor causes its capacitance to vary. The capacitive sensor is linked to a management unit that triggers the locking or unlocking of the door as a function of the information conveyed by the capacitive sensor, i.e. as a function of the variation in capacitance of the latter.

A drawback of this type of device lies in the fact that the projection of a body of water onto the door, for example during a rain shower or when the vehicle is being washed, can be interpreted by the capacitive sensor as an action of the user and triggers the locking or unlocking of the opening panel in an accidental manner. This is explained by the similarity of the induced electrical effects.

The aim of the device of the invention is therefore more particularly to remedy the drawbacks of the aforementioned prior art. In this context, the invention aims to propose a device for triggering an action on an opening panel of a motor vehicle making it possible to ensure that the performed action is carried out by a hand or at least a finger of a user.

For this purpose, the invention concerns a device for triggering an action on an opening panel of a motor vehicle including:
  a capacitive sensor for detecting a variation in capacitance including at least three electrodes, said at least three electrodes forming a detection pattern,
  a processing unit linked to said capacitive sensor to process the output signals of said capacitive sensor, said output signals being representative of the capacitance of each of the electrodes,
said triggering device being characterized in that:
  the positioning of said electrodes is defined in such a way that at least one of said electrodes is not covered by a hand approaching said detection pattern,
  said processing unit is adapted to carry out a triggering action on the opening panel of the motor vehicle when a hand approaches said detection pattern.

The term "approaching" is understood to mean the fact of being at a short distance from the detection pattern or of brushing against said pattern.

The device for triggering an action on an opening panel of a motor vehicle makes it possible to ensure that the user desires to carry out an action to lock or unlock the doors of a vehicle before carrying out said action.

As the hand of the user only covers part of the surface of the pattern, the hand can only come into contact with a limited number of electrodes, for example two out of three. In this case, the processing unit detects that the capacitance of two of the three electrodes varies and that the capacitance of one of the three electrodes does not vary. The fact that the capacitance of one of the three electrodes does not vary makes it possible to ensure with certainty that the locking or the unlocking is really desired by the user.

By contrast, as the hand of the user only covers part of the pattern, if a simultaneous variation in the capacitance of the three electrodes is detected by the processing unit, then the device deduces therefrom that it is not an action of the user. These variations can be due simply to a shower of rain or a jet of washing water. In this case, no locking or unlocking action is carried out.

In other words, it is possible to tell the projection of a body of water onto the device apart from the approach of a hand of the user in the direction of the device for triggering an action on an opening panel of a motor vehicle.

The device for triggering an action on an opening panel of a motor vehicle according to the invention can also have one or more of the features below, considered individually or in all the technically achievable combinations.

In a non-limiting embodiment, the at least three detecting electrodes are spaced apart from each other. Such a spacing makes it possible to ensure that the capacitance of an electrode does not influence the capacitance of a neighboring electrode.

In a non-limiting embodiment, the at least three detecting electrodes are irregularly spaced in such a way that the density of the electrodes is higher in a determined region.

In a non-limiting embodiment, two electrodes are spaced by a maximum distance in such a way that a hand approaching the detection pattern simultaneously covers said two electrodes.

In a non-limiting embodiment, the capacitive sensor is a tactile sensor.

In a non-limiting embodiment, the triggering action on the opening panel is an action of locking or unlocking said opening panel.

In a non-limiting embodiment, the device for triggering an action on an opening panel of a motor vehicle is adapted to be positioned on a gripping lever of a door of a motor vehicle.

The invention also relates to a gripping lever of a door of a motor vehicle including a device for triggering an action on an opening panel of a motor vehicle according to the invention.

Another subject of the invention is a method for triggering an action on an opening panel of a motor vehicle implementing the device for triggering an action on an opening panel of a motor vehicle according to the invention. The method includes the steps of:
  detecting the variation in capacitance of at least one of the electrodes, said detection being performed by the processing unit of the capacitive sensor,
  triggering an action on an opening panel of a motor vehicle by the processing unit, said triggering being performed if a variation in capacitance is detected on at least one of the electrodes and if, simultaneously with this variation in capacitance, the capacitance of at least one of the electrodes remains fixed.

Figure 2:
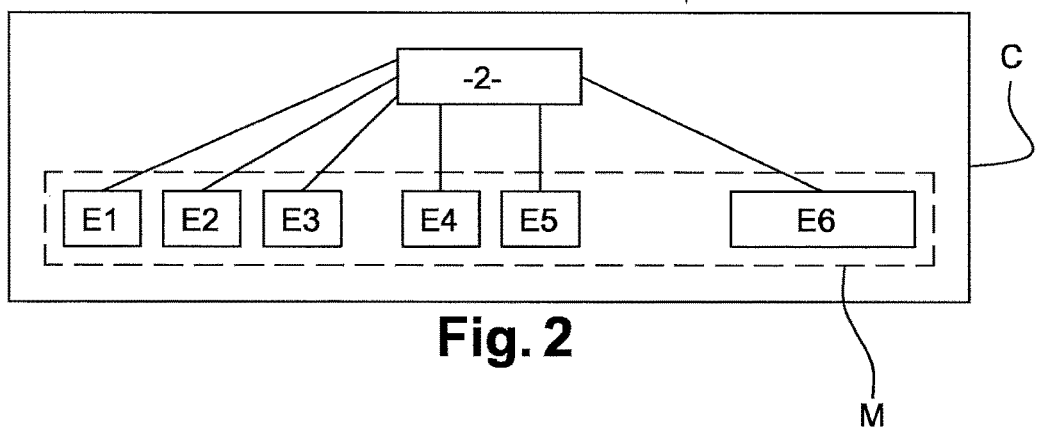
Figure 3:
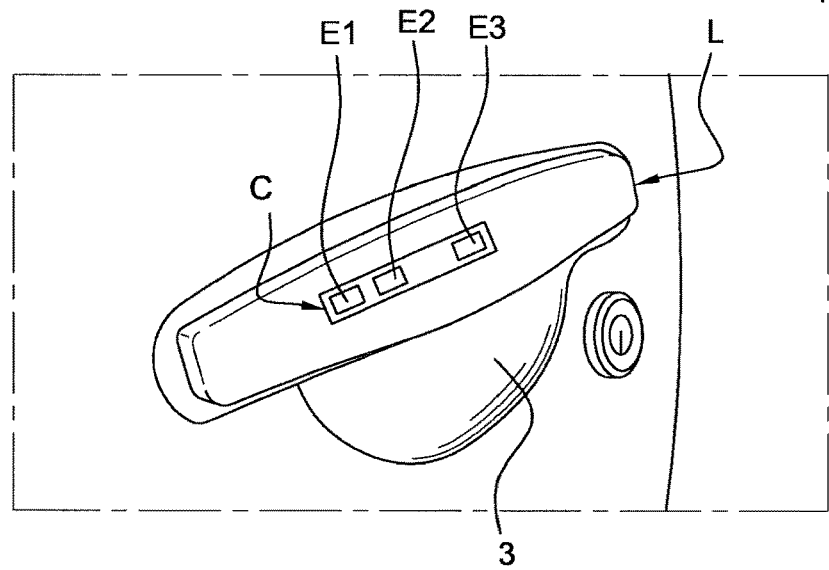
Figure 4:
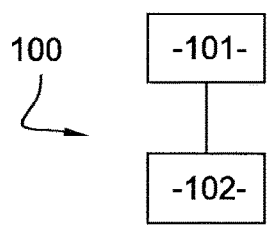

Other features and advantages of the invention will become clear from the description of them that is given hereinafter, only by way of illustration and without in any way limiting the invention, with reference to the attached appended figures, among which:

FIG. 1 illustrates a first non-limiting embodiment of a device for triggering an action on an opening panel of a motor vehicle according to the invention, FIG. 2 illustrates a second non-limiting embodiment of a device for triggering an action on an opening panel of a motor vehicle in accordance with the invention, FIG. 3 represents a non-limiting embodiment of a gripping lever of a door of a motor vehicle in accordance with the invention, FIG. 4 illustrates, in a non-limiting manner, the steps of a method for triggering an action on an opening panel of a motor vehicle in accordance with the invention.

For reasons of clarity, only the elements which are essential to an understanding of the invention have been represented, doing so in a schematic manner which is not to scale.

FIG. 1 illustrates a device 1 for triggering an action on an opening panel of a motor vehicle. The device 1 includes a capacitive sensor C for detecting a variance in capacitance including three electrodes E1, E2, E3.

The association of the electrode E1, the electrode E2 and the electrode E3 forms a detection pattern M.

The detection device 1 also includes a processing unit 2 linked to the capacitive sensor C to process the output signals of the capacitive sensor C. Each output signal that the processing unit 2 receives is representative of the capacitance of one of the three electrodes E1, E2, E3.

It should be noted that the positioning of the electrodes E1, E2, E3 is defined in such a way that at least one of the electrodes E1, E2, E3 is not covered by a hand approaching the detection pattern M. In other words, according to this configuration, a hand approaching the detection pattern M cannot cover the totality of the surfaces of the three electrodes E1, E2, E3. This means that when a hand approaches the detection pattern M, the capacitance of at least one of the three electrodes does not vary (i.e. the capacitance of at least one of the three electrodes remains fixed) while the capacitance of the two other electrodes varies.

In the example illustrated in FIG. 1, the three electrodes E1, E2, E3 are irregularly spaced apart from each other. The density of the electrodes E1, E2 is higher in the determined region R located on the right-hand side of the detection pattern M. In this non-limiting example, the electrodes E1 and E2 are spaced by a maximum distance in such a way that a hand approaching the detection pattern M simultaneously covers the two electrodes E1 and E2. By way of example, the maximum distance is of . . .

The determined region R corresponds to a region more accessible by a user, in other words the region R where the user will naturally position his hand when he desires to open a door on which the triggering device 1 is positioned.

Furthermore, the processing unit 2 is adapted to carry out a triggering action on the opening panel of the motor vehicle when a hand approaches the detection pattern M.

More particularly, the processing unit 2 is adapted to detect a variation in the capacitance of at least one of the electrodes E1, E2, E3, for example E1 and E2. Moreover, the processing unit 2 is adapted to trigger an action on the opening panel of the motor vehicle if a variation in capacitance is detected on at least one of the electrodes, E1 and E2 in our example, and if, simultaneously with this variation in capacitance, the capacitance of at least one of the electrodes remains fixed, E3 in our example.

The triggering action is an action of unlocking or locking the opening panel of the motor vehicle. In a non-limiting manner, the unlocking or locking action can be carried out on only one door or on all the doors of the vehicle.

In a non-limiting embodiment, the capacitive sensor C is a tactile sensor.

In a particular embodiment, the device is adapted to be positioned inside a gripping lever (i.e. a handle) of a door of a motor vehicle.

As illustrated in FIG. 2, it is understood that the capacitive sensor C can include more than three electrodes, for example six electrodes E1, E2, E3, E4, E5, E6. In this case, a hand can for example cause the capacitance of the electrodes E1, E2, E3 or of the electrodes E4, E5 or else of the electrodes E5 and E6 to vary simultaneously.

In a non-limiting embodiment, the processing unit 2 is a computer program product that includes as input parameters the output signals of the capacitive sensor C.

In an embodiment, a device 1 for triggering an action on an opening panel of a motor vehicle is incorporated into a gripping lever L of a door of a motor vehicle. In the embodiment illustrated in FIG. 3, the gripping lever L has an inner recess 3 in which the capacitive sensor C is incorporated. In the example illustrated in FIG. 3, the electrodes E1, E2, E3 are irregularly spaced over the surface of the recess 3 gripping lever L. The electrodes E1, E2, E3 are also arranged in a line over the surface of the recess 3. By this specific arrangement, a hand approaching the detection pattern cannot cover the totality of the electrodes E1, E2, E3 to trigger an action of locking or unlocking the opening panel of the motor vehicle.

FIG. 4 illustrates a method 100 for triggering an action on an opening panel of a motor vehicle implemented by the device 1. The method 100 includes the steps of:
- detecting 101 the variation in capacitance of at least one of the electrodes, the detection being performed by the processing unit 2 of the capacitive sensor C,
- triggering 102 an action on an opening panel of a motor vehicle by the processing unit 2, the triggering 102 is performed if a variation in capacitance is detected on at least one of the electrodes and if, simultaneously with this variation in capacitance, the capacitance of at least one of the electrodes remains fixed.

The invention claimed is:

1. A device for triggering an action on an opening panel of a motor vehicle comprising:
   a capacitive sensor for detecting a variation in capacitance including only three electrodes comprising a first electrode, a second electrode, and a third electrode, said three electrodes forming a detection pattern, wherein the second electrode and the third electrode of the three electrodes are spaced apart by a first distance, wherein the first electrode and the second electrode are spaced apart by a second, and wherein no electrode is disposed within the first distance; and
   a processing unit linked to said capacitive sensor to process the output signals of said capacitive sensor, said output signals being representative of the capacitance of each of the three electrodes,
   wherein the second distance is significantly less than the first distance such that a user's hand approaching the first electrode does not cause a first varying capacitance detectable by said processing unit in the third electrode,
   wherein said processing unit is adapted to:
      carry out a triggering action on the opening panel of the motor vehicle only when capacitance is detected at at least one of the first electrode and the second electrode, while no capacitance is detected at the third electrode,
   wherein the device is positioned on a gripping lever on the opening panel, and
   wherein the three electrodes are positioned on the gripping lever of the opening panel of the motor vehicle in a region aligned with a recess in the opening panel, the recess configured to accommodate the user's hand operating the gripping lever.

2. The device as claimed in claim 1, wherein the three electrodes are irregularly spaced in such a way that the density of the electrodes is higher in a determined region.

3. The device as claimed in claim 1, wherein two electrodes are spaced by a maximum distance in such a way that the user's hand approaching the detection pattern simultaneously covers said two electrodes.

4. The device as claimed in claim 1, wherein the capacitive sensor is a tactile sensor.

5. The device as claimed in claim 1, wherein the triggering action on the opening panel is an action of locking or unlocking said opening panel.

6. A gripping lever of a door of a motor vehicle including a device for triggering an action on an opening panel of a motor vehicle as claimed in claim 1.

7. The device as claimed in claim 1, wherein the three electrodes are arranged on a surface of the gripping lever opposite to the recess.

8. A method for triggering an action on an opening panel of a motor vehicle the method comprising:

detecting, using a capacitive sensor comprising only three electrodes comprising a first electrode, a second electrode, and a third electrode, a variation in capacitance of at least one of the three electrodes, said detection being performed by a processing unit of the capacitive sensor, wherein the second electrode and the third electrode of the three electrodes are spaced apart by a first distance, wherein the first electrode and the second electrode are spaced apart by a second distance, wherein no electrode is disposed within the first distance, and wherein the second distance is significantly less than the first distance such that a user's hand approaching the first electrode does not cause in the third electrode a varying capacitance detectable by said processing unit; and triggering the action on the opening panel of the motor vehicle by the processing unit, only when capacitance is detected at at least one of the first electrode and the second electrode, while no capacitance is detected at the third electrode, wherein the capacitive sensor is positioned on a gripping lever on the opening panel; and wherein the three electrodes are positioned on the gripping lever of the opening panel of the motor vehicle in a region aligned with a recess in the opening panel, the recess configured to accommodate a user's hand operating the gripping lever.

* * * * *